United States Patent
Lee et al.

(10) Patent No.: US 10,777,279 B2
(45) Date of Patent: Sep. 15, 2020

(54) NON-VOLATILE MEMORY DEVICE AND METHOD OF ERASING THE SAME

(71) Applicant: SAMSUNG ELECTRONICS CO., LTD., Suwon-si, Gyeonggi-do (KR)

(72) Inventors: Jun-Gyu Lee, Hwaseong-si (KR); Sung-Whan Seo, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/197,886

(22) Filed: Nov. 21, 2018

(65) Prior Publication Data
US 2019/0156897 A1 May 23, 2019

(30) Foreign Application Priority Data
Nov. 22, 2017 (KR) .......... 10-2017-0156615

(51) Int. Cl.
| | |
|---|---|
| *G11C 11/34* | (2006.01) |
| *G11C 16/16* | (2006.01) |
| *H01L 27/11556* | (2017.01) |
| *H01L 27/11582* | (2017.01) |
| *G11C 16/08* | (2006.01) |
| *G11C 16/32* | (2006.01) |
| *G11C 16/04* | (2006.01) |
| *G11C 16/30* | (2006.01) |
| *H01L 27/1157* | (2017.01) |

(Continued)

(52) U.S. Cl.
CPC .............. *G11C 16/16* (2013.01); *G11C 5/146* (2013.01); *G11C 16/0483* (2013.01); *G11C 16/08* (2013.01); *G11C 16/30* (2013.01); *G11C 16/32* (2013.01); *H01L 27/1157* (2013.01); *H01L 27/11556* (2013.01); *H01L 27/11582* (2013.01); *G11C 11/5671* (2013.01)

(58) Field of Classification Search
CPC ..... G11C 16/16; G11C 5/146; G11C 16/0483; G11C 16/08; G11C 16/30; G11C 16/32; G11C 11/5671; H01L 27/11556; H01L 27/1157; H01L 27/11582
USPC .............................................. 365/185.1, 218
See application file for complete search history.

(56) References Cited

U.S. PATENT DOCUMENTS

| | | |
|---|---|---|
| 7,813,184 B2 | 10/2010 | Kim et al. |
| 8,542,535 B2 | 9/2013 | Dutta et al. |

(Continued)

FOREIGN PATENT DOCUMENTS

KR  10-2009-0070607  7/2009

*Primary Examiner* — Viet Q Nguyen
(74) *Attorney, Agent, or Firm* — F. Chau & Associates, LLC

(57) ABSTRACT

A non-volatile memory device includes a substrate; a memory cell array on the substrate; a control logic circuit configured to output an erase enable signal for controlling an erase operation with respect to the memory cell array; a substrate bias circuit configured to, in response to the erase enable signal, output a first target voltage to the substrate as a substrate bias voltage during a first delay time and, after the first delay time, output the substrate bias voltage to the substrate while gradually increasing a level of the substrate bias voltage to that of an erase voltage having a higher level than the first target voltage; and a row decoder configured to apply a ground voltage to the ground select line based on control of the control logic circuit during the first delay time.

20 Claims, 12 Drawing Sheets

(51) Int. Cl.
*G11C 5/14* (2006.01)
*G11C 11/56* (2006.01)

(56) References Cited

U.S. PATENT DOCUMENTS

| | | | |
|---|---|---|---|
| 8,553,466 B2 * | 10/2013 | Han | G11C 16/04 |
| | | | 365/185.18 |
| 8,570,808 B2 | 10/2013 | Park et al. | |
| 8,670,285 B2 | 3/2014 | Dong et al. | |
| 8,848,456 B2 * | 9/2014 | Han | G11C 16/04 |
| | | | 365/185.18 |
| 8,923,064 B2 | 12/2014 | Park et al. | |
| 8,953,371 B2 | 2/2015 | Shiino et al. | |
| 9,201,440 B2 * | 12/2015 | Makiyama | G05F 1/625 |
| 9,286,994 B1 | 3/2016 | Chen et al. | |
| 9,318,209 B1 | 4/2016 | Huynh et al. | |
| 9,490,020 B2 | 11/2016 | Louie et al. | |
| 9,659,662 B2 | 5/2017 | Nam et al. | |
| 2001/0046156 A1 * | 11/2001 | Miyazaki | G11C 5/143 |
| | | | 365/156 |

* cited by examiner

| SSL | Float |
| --- | --- |
| WL | Vwe |
| GSL | VSS → Float |
| SUB | V_TG1 → V_ERS |

NON-VOLATILE MEMORY DEVICE AND METHOD OF ERASING THE SAME

CROSS-REFERENCE TO RELATED APPLICATION

This U.S. application claims the benefit of priority under 35 U.S.C. § 119 to Korean Patent Application No. 10-2017-0156615, filed on Nov. 22, 2017, in the Korean Intellectual Property Office, the disclosure of which is incorporated by reference in its entirety herein.

BACKGROUND

1. Technical Field

The inventive concept relates to a memory device, and more particularly, to a non-volatile memory device and a method of erasing the same.

2. Discussion of Related Art

In recent years, as information communication devices have become multi-functional, there has been a demand for memory devices having a large capacity and high integration. As sizes of memory cells are reduced for high integration, operation circuits and wiring structures included in memory devices are becoming complicated. Therefore, there is a demand for a memory device having improved electrical characteristics and improved reliability while improving the integration of the memory device.

SUMMARY

At least one embodiment of the inventive concept provides a non-volatile memory device having a vertical structure and a method of erasing the same.

According to an exemplary embodiment of the inventive concept, there is provided a non-volatile memory device including a substrate, a memory cell array, a control logic circuit, a substrate bias circuit, and a row decoder. The memory cell array includes a plurality of gate conductive layers stacked on the substrate and a plurality of pillars penetrating through the plurality of gate conductive layers and extending in a direction perpendicular to a top surface of the substrate. At least one of the plurality of gate conductive layers is a ground select line. The control logic circuit is configured to output an erase enable signal for controlling an erase operation with respect to the memory cell array. The substrate bias circuit is configured to, in response to the erase enable signal, output a first target voltage to the substrate as a substrate bias voltage during a first delay time and, after the first delay time, output the substrate bias voltage to the substrate while gradually increasing a level of the substrate bias voltage to that of an erase voltage having a higher level than the first target voltage. The row decoder is configured to apply a ground voltage to the ground select line based on control of the control logic circuit during the first delay time.

According to an exemplary embodiment of the inventive concept, there is provided a method of erasing a non-volatile memory device including a substrate and a plurality of memory blocks including a plurality of cell strings, which are provided on the substrate and each include one or more ground select transistors and a plurality of cell transistors that are stacked in a direction perpendicular to the substrate, the method including a control circuit of the non-volatile memory device applying a ground voltage to a ground select line connected to the ground select transistor and a first target voltage to the substrate as a substrate bias voltage, during a first delay time; and the control circuit applying the substrate bias voltage to the substrate while gradually increasing a level of the substrate bias voltage to that of an erase voltage having a higher level than the first target voltage, after the first delay time.

According to an exemplary embodiment of the inventive concept, there is provided a method of erasing a non-volatile memory device including a substrate and a plurality of memory blocks including a plurality of gate conductive layers stacked on the substrate and a plurality of pillars penetrating through the plurality of gate conductive layers and extending in a direction perpendicular to a top surface of the substrate, the method including a control circuit of the non-volatile memory device applying a first target voltage in the form of step-pulses to the substrate for a first delay time as a substrate bias voltage, in response to an erase enable signal; the control circuit applying the substrate bias voltage to the substrate while gradually increasing the level of the substrate bias voltage from the level of the first target voltage to that of an erase voltage having a higher level than the first target voltage; and the control circuit applying the erase voltage to the substrate as the substrate bias voltage.

According to an exemplary embodiment of the inventive concept, there is provided a non-volatile memory device including a substrate, a memory cell array disposed on the substrate, and a control circuit configured to output a target voltage to the substrate during a first period of an erase operation of at least one memory block of the memory cell array, gradually increase a level of the target voltage output to the substrate to an erase voltage during a second period of the erase operation after the first period, and maintain the target voltage at the erase voltage during a third period after the second period until the erase operation completes.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

Figure 1:
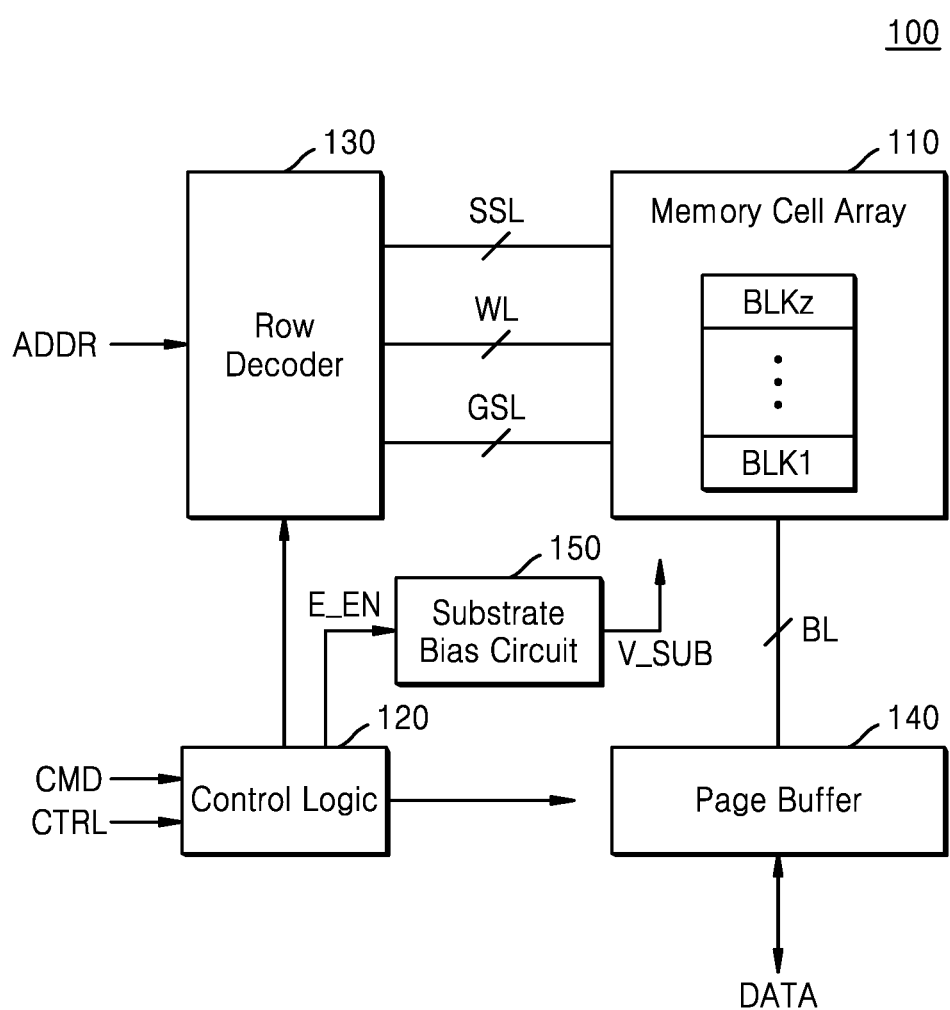
FIG. 1 is a block diagram showing a memory device according to an exemplary embodiment of the inventive concept.

FIG. 1 is a block diagram showing a memory device according to an exemplary embodiment of the inventive concept.

Referring to FIG. 1, a memory device 100 includes a memory cell array 110, a control logic circuit 120, a row decoder 130, a page buffer 140, and a substrate bias circuit 150. Although not shown, the memory device 100 may further include a data input/output circuit or an input/output interface. Although not shown, the memory device 100 may further include various sub-circuits including a voltage generating circuit for generating various voltages needed for operating the memory device 100 and an error correction circuit for correcting errors of data read from the memory cell array 110.

The memory cell array 110 may include a plurality of memory cells. In an embodiment, the memory cell array is connected to string select lines SSL, word lines WL, ground select lines GSL, and bit lines BL. In an embodiment, the memory cell array 110 is connected to the row decoder 130 through the string select lines SSL, the word lines WL, and the ground select lines GSL and is connected to the page buffer 140 via the bit lines BL. The page buffer 140 may be used to temporarily store data before it is written to the memory cell array 110 or to temporarily store data read from the memory cell array before it is output to an external device.

For example, the plurality of memory cells included in the memory cell array 110 may be non-volatile memory cells that retain stored data even when power supplied thereto is interrupted. In detail, when the plurality of memory cells are non-volatile memory cells, the memory device 100 may be electrically erasable programmable read-only memory (EE-PROM), a flash memory, phase change random access memory (PRAM), resistance random access memory (RRAM), a nano floating gate memory (NFGM), polymer random access memory (PoRAM), magnetic random access memory (MRAM), or ferroelectric random access memory (FRAM). Exemplary embodiments of the inventive concept will be described below assuming the plurality of memory cells are NAND flash memory cells, but the inventive concept is not limited thereto.

The memory cell array 110 includes a plurality of memory blocks BLK1 through BLKz, and each memory block may have a planar structure or a 3-dimensional structure. The memory cell array 110 may include at least one of a single-level cell block including single-level cells (SLC), a multi-level cell block including multi-level cells (MLC), a triple-level cell block including triple-level cells (TLC), and a quad-level cell block including quad-level cells (QLC). For example, some memory blocks of the plurality of memory blocks BLK1 through BLKz may be single-level cell blocks, whereas the other memory blocks may be multi-level cell blocks, triple-level cell blocks, or quad-level cell blocks.

The control logic circuit 120 receives a command CMD and a control signal CTRL from an external device outside the memory device 100. The control logic circuit 120 may control the overall operation of the memory device 100. The control logic circuit 120 may control the memory device 100 to perform a memory operation corresponding to the command CMD provided from, for example, a memory controller (not shown). For example, the command CMD may be a read command, a write command, or a delete command. The control logic circuit 120 may generate various internal control signals used in the memory device 100 in response to the control signal CTRL provided from the memory controller (not shown). For example, the control logic circuit 120 may adjust levels of voltages provided to the word lines WL, the bit lines BL, and the ground select lines GSL when performing a memory operation such as a program operation or an erase operation.

In an exemplary embodiment, when an erase operation is performed, the control logic circuit 120 outputs an erase enable signal E_EN to the substrate bias circuit 150 for controlling the erase operation. In an embodiment, the control logic circuit 120 activates the erase enable signal E_EN after determining that the command CMD is an erase command. The control logic circuit 120 outputs the erase enable signal E_EN to control the substrate bias circuit 150 to output a substrate bias voltage V_SUB to a substrate supporting the memory cell array 110. For example, the memory cell array 110 is disposed on the substrate. According to an exemplary embodiment, the control logic circuit 120 controls the substrate bias circuit 150 to generate a first target voltage during a first delay time as the substrate bias voltage V_SUB and, after the first delay time, generates a substrate bias voltages V_SUB with gradually increased voltage levels until the voltage level of the substrate bias voltage V_SUB reaches that of an erase voltage, wherein the voltage level of the erase voltage is higher than that of the first target voltage. In an embodiment, the erase voltage is used to perform the erase operation.

The row decoder 130 receives an address ADDR. For example, the row decoder 130 receives the address ADDR from a device outside the memory device 100. The row decoder 130 may select at least one of the plurality of memory blocks BLK1 through BLKz in response to the address ADDR provided from a memory controller (not shown), for example. The row decoder 130 may select at least one of the word lines of a memory block selected in response to the address ADDR.

The row decoder 130 may transfer voltages for performing a memory operation to word lines WL of a selected memory block (e.g., BLK1). For example, during a program operation, the row decoder 130 may transfer a program voltage and a verify voltage to a selected word line and transfer a pass voltage to an unselected word line. For example, a selected word line may correspond to a first part of the memory cell array 110 to be written with data and an unselected word line may correspond to a second part of the memory cell array 110 that is not to be written with the data while the first part is being written. Furthermore, the row decoder 130 may select some of the string select lines SSL in response to the address ADDR.

In an embodiment, the row decoder 130 floats the ground select lines GSL based on a control of the control logic circuit 120 when an erase operation is performed. According to an exemplary embodiment, when an erase operation is performed, the row decoder 130 floats the ground select lines GSL after the first delay time in which the first target voltage is generated as the substrate bias voltage V_SUB.

The page buffer 140 may receive data DATA from a device outside the memory device 100 and transmit the received data DATA to the memory cell array 110. The page buffer 140 is connected to the memory cell array 110 via the bit lines BL. The page buffer 140 may operate as a write driver or a sense amplifier. In an embodiment, during a program operation, the page buffer 140 operates as a write driver and applies voltages according to the data DATA to be stored in the memory cell array 110 to the bit lines BL. In addition, during a read operation, the page buffer 140 may operate as a sense amplifier and sense the data DATA stored in the memory cell array 110.

In an exemplary embodiment, the substrate bias circuit 150 outputs the substrate bias voltage V_SUB based on the erase enable signal E_EN output from the control logic circuit 120. According to an exemplary embodiment, in response to the erase enable signal E_EN, the substrate bias circuit 150 generates the first target voltage as the substrate bias voltage V_SUB for output to the substrate supporting the memory cell array 110 during the first delay time. Furthermore, after the first delay time, the substrate bias voltages V_SUB with gradually increased voltage levels are generated until the voltage level of the substrate bias voltage V_SUB reaches that of an erase voltage, wherein the voltage level of the erase voltage is higher than that of the first target voltage.

Figure 2:
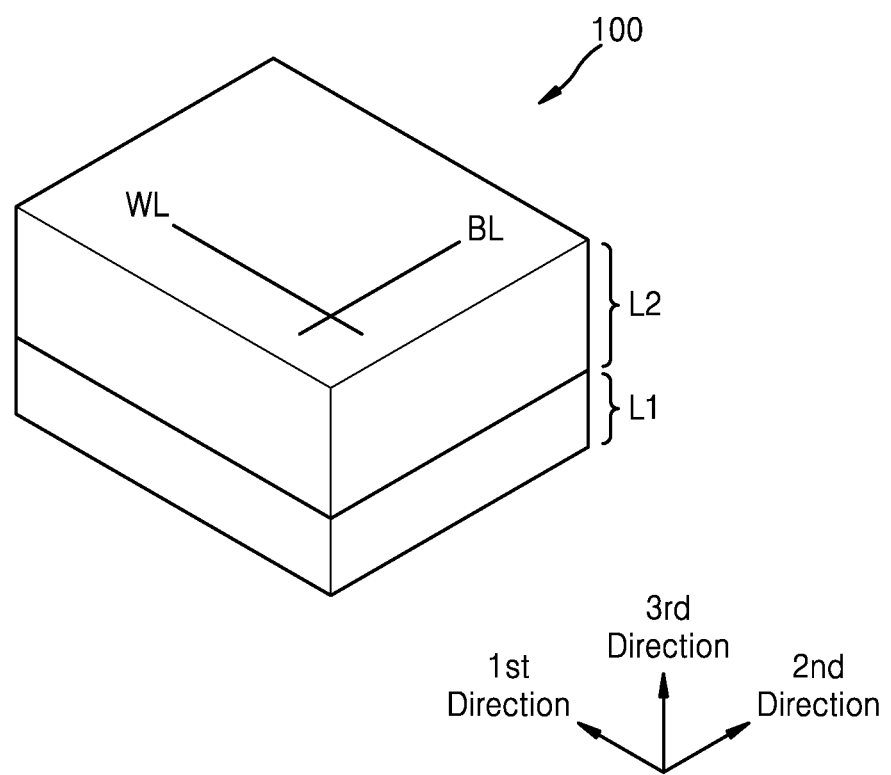
FIG. 2 is a schematic diagram showing the structure of a memory device according to an exemplary embodiment of the inventive concept.

FIG. 2 is a schematic diagram showing the structure of a memory device according to an exemplary embodiment of the inventive concept. FIG. 2 shows an example of the structure of the memory device 100 of FIG. 1. Hereinafter, FIG. 2 will be described with reference to FIG. 1.

Referring to FIG. 2, the memory device 100 includes a first semiconductor layer L1 and a second semiconductor layer L2. The second semiconductor layer L2 may be deposited on the first semiconductor layer L1 in a third direction. According to an exemplary embodiment, the memory cell array 110 is formed in the second semiconductor layer L2, and at least one of the control logic circuit 120, the row decoder 130, the page buffer 140, and the substrate bias circuit 150 is arranged in the first semiconductor layer L1. For example, the first semiconductor layer L1 may include a lower substrate and, by arranging semiconductor elements like transistors and patterns for wiring the semiconductor elements on the lower substrate, various circuits may be disposed in the first semiconductor layer L1.

After circuits are disposed in the first semiconductor layer L1, the second semiconductor layer L2 including the memory cell array 110 may be disposed. For example, the second semiconductor layer L2 may include a substrate, and, by arranging a plurality of gate conductive layers stacked on the substrate and a plurality of pillars, which penetrate through the plurality of gate conductive layers and extend in a direction perpendicular to the top surface of an upper substrate (e.g., a third direction), the memory cell array 110 may be disposed on the second semiconductor layer L2. Furthermore, in the second semiconductor layer L2, patterns for electrically interconnecting the memory cell array 110 (that is, the word lines WL and the bit lines BL) and the circuits disposed in the first semiconductor layer L1 may be arranged. For example, the word lines WL may extend in a first direction and be arranged in a second direction. Furthermore, the bit lines BL may extend in the second direction and be arranged in the first direction.

Therefore, the memory device 100 may have a structure in which peripheral circuits like the control logic circuit 120, the row decoder 130, the page buffer 140, and the substrate bias circuit 150 and the memory cell array 110 are arranged in a stacking direction (e.g., the third direction), that is, a Cell-On-Peri or Cell-Over-Peri (COP) structure. By disposing circuits other than the memory cell array 110 below the memory cell array 110, the COP structure may effectively reduce occupied areas on the plane perpendicular to the stacking direction, and thus the number of memory cells integrated in the memory device 100 may be increased.

Although not shown in FIG. 2, a plurality of pads may be arranged on the memory device 100 for electrical connection with a device outside the memory device 100. For example, a plurality of pads for commands CMD, addresses ADDR, and control signals CTRL received from a device outside the memory device 100 may be arranged and a plurality of pads for inputting and outputting data DATA may be arranged. The plurality of pads may be arranged adjacent to peripheral circuits, which process signals received from a device outside the memory device 100 or signals transmitted to a device outside the memory device 100, in a vertical direction (the third direction) or a horizontal direction (the first direction or the second direction).

Figure 3:
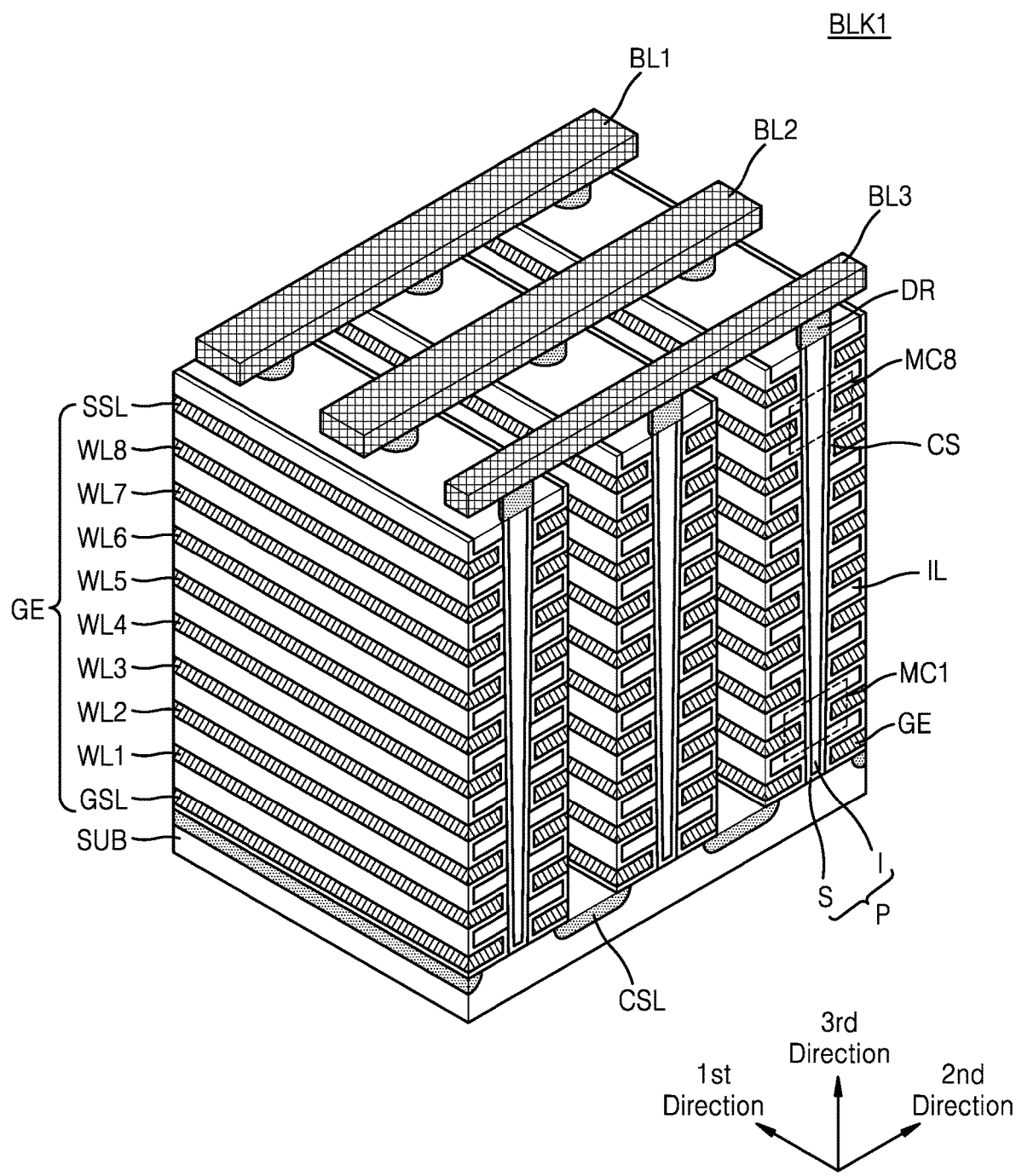
FIG. 3 is a perspective view diagram showing an embodiment of a first memory block from among the memory blocks of FIG. 1.

FIG. 3 is a perspective view diagram showing an embodiment of a first memory block from among the memory blocks of FIG. 1.

Referring to FIG. 3, a first memory block BLK1 may be disposed in a direction perpendicular to a substrate SUB. Although FIG. 3 shows that the first memory block BLK1 includes two select lines GSL and SSL, eight word lines WL1 through WL8, and three bit lines BL1 through BL3, the first memory block BLK1 may include more or less of these lines. Furthermore, in another example, the first memory block BLK1 includes one or more dummy word lines between a first word line WL1 and the ground select line GSL.

The substrate SUB may be a poly-silicon film doped with a first conductivity type, e.g., p-type. The substrate SUB may be a bulk silicon substrate, a silicon-on-insulator (SOI) substrate, a germanium substrate, a germanium-on-insulator (GOI) substrate, a silicon germanium substrate, or an epitaxial thin-film substrate obtained by performing selective epitaxial growth (SEG). The substrate SUB may include a semiconductor material and, for example, may include at least one of silicon (Si), germanium (Ge), silicon germanium (SiGe), gallium arsenide (GaAs), indium gallium arsenide (InGaAs), aluminum gallium arsenide (AlGaAs), or a mixture thereof.

In an embodiment, the substrate SUB is provided with a common source line CSL. For example, the common source line CSL is disposed on the substrate SUB to extend in the first direction. In an embodiment, the common source line CSL is doped with impurities of the second conductivity type (e.g., n-type). A plurality of first insulation films IL extending in the first direction are sequentially provided in the third direction on a region of the substrate SUB between two adjacent common source lines CSL. The plurality of first insulation films IL may be spaced a certain distance from one another in the third direction. There may be additional pluralities of insulation films IL disposed on the substrate SUB between other adjacent common source lines CSL. For example, the plurality of insulation films IL may include an insulation material such as silicon oxide.

A plurality of pillars P, which are arranged sequentially in the first direction and penetrate through the plurality of insulation films IL, may be provided on a region of the substrate SUB between two adjacent common source lines CSL. For example, the plurality of pillars P may penetrate through the plurality of insulation films IL and contact the substrate SUB. In an embodiment, a surface layer S of each pillar P includes a silicon material doped with the first conductivity type and functions as a channel region. In an exemplary embodiment, an internal layer I of each pillar P includes an insulation material such as silicon oxide or an air gap.

In the region between two adjacent common source lines CSL, a charge storage layer CS may be provided along the plurality of insulation films IL, the plurality of pillars P, and an exposed surface of the substrate SUB. The charge storage layer CS may include a gate insulation layer (may also be referred to as a 'tunnelling layer'), a charge trapping layer, and a blocking insulation layer. For example, the charge storage layer CS may have an oxide-nitride-oxide (ONO) structure. Furthermore, on an exposed surface of the charge storage layer CS in the region between two adjacent common source lines CSL, gate electrodes GE like the select lines GSL and SSL and the word lines WL1 through WL8 may be provided.

Drains or drain contacts DR may be provided on the plurality of pillars P, respectively. For example, the drains or drain contacts DR may include silicon material doped with impurities of the second conductivity type. On drain contacts DR, the bit lines BL1 through BL3 extending in the second direction and spaced a certain distance apart from one another in the first direction may be provided.

Figure 4:
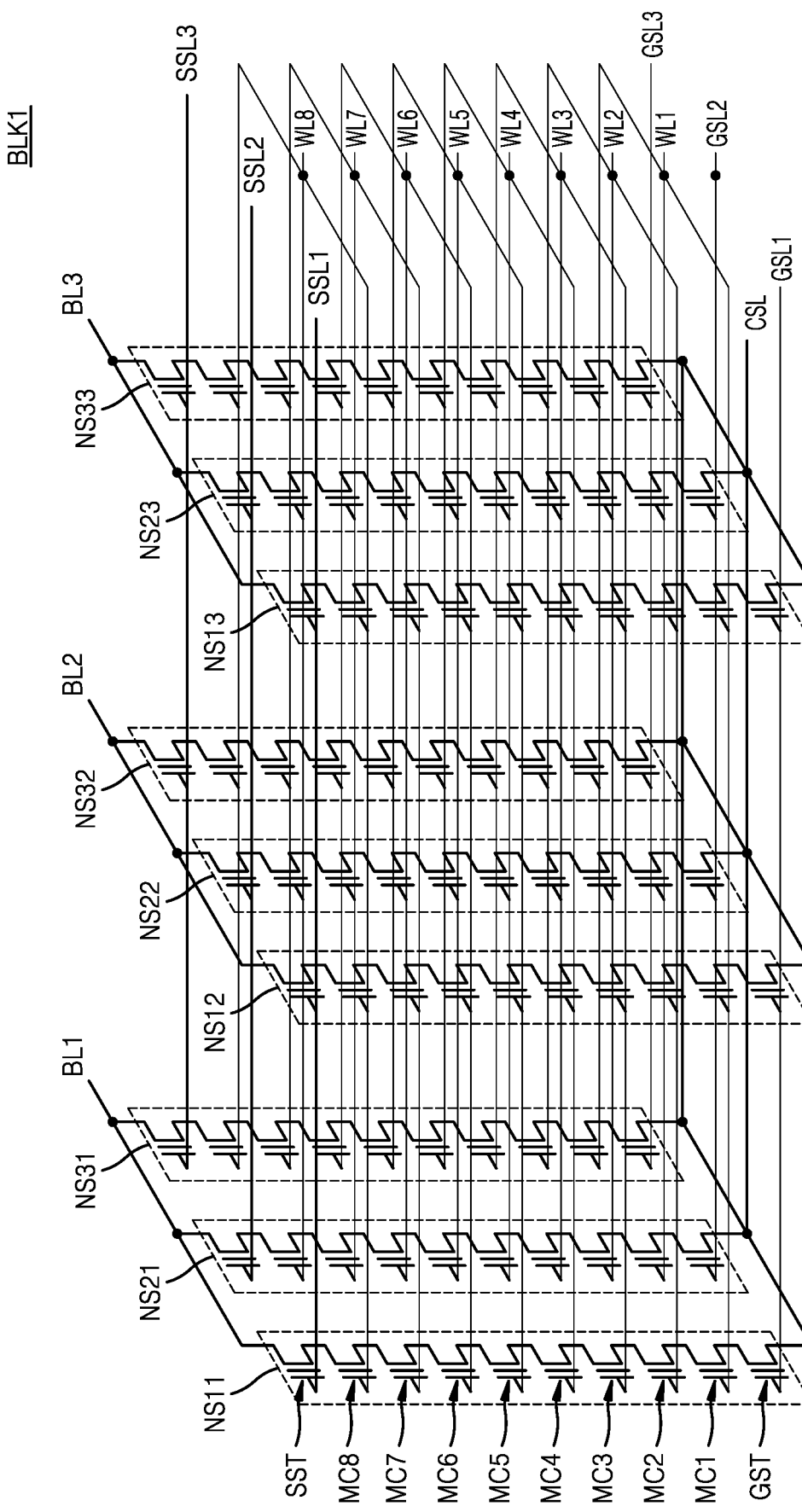
FIG. 4 is a circuit diagram showing an equivalent circuit of a first memory block from among the memory blocks of FIG. 1.

FIG. 4 is a circuit diagram showing an equivalent circuit of a first memory block from among the memory blocks of FIG. 1.

Referring to FIG. 4, the first memory block BLK1 may be a vertical NAND flash memory, and each of the plurality of memory block BLK1 through BLKz shown in FIG. 1 may be implemented as shown in FIG. 4. In an exemplary embodiment, the first memory block BLK1 includes a plurality of NAND cell strings NS11 through NS33, the plurality of word lines WL1 through WL8, the plurality of bit lines BL1 through BL3, a plurality of ground select lines GSL1 through GSL3, a plurality of string select lines SSL1 through SSL3, and the common source line CSL. Here, the number of NAND cell strings, the number of word lines, the number of bit lines, the number of ground select lines, and the number of string select lines may vary according to embodiments. For example, the number of ground select lines may be different from the number of string select lines.

NAND cell strings NS11, NS21, and NS31 are provided between a first bit line BL1 and the common source line CSL, NAND string cells NS12, NS22, and NS32 are provided between a second bit line BL2 and the common source line CSL, and NAND cell strings NS13, NS23, and NS33 are provided between a third bit line BL3 and the common source line CSL. Each NAND cell string (e.g., NS11) may include a string select transistor SST, a plurality of memory cells MC1 through MC8, and a ground select transistor GST that are connected in series.

NAND cell strings connected to one bit line in common may constitute one column. For example, NAND cell strings NS12, NS21, and NS31 connected to the first bit line BL1 in common may correspond to a first column, NAND cell strings NS12, NS22, and NS32 connected to the second bit line BL2 in common may correspond to a second column, and NAND cell strings NS13, NS23, and NS33 connected to the third bit line BL3 in common may correspond to a third column.

NAND cell strings connected to one string select line in common may constitute one row. For example, NAND cell strings NS11, NS12, and NS13 connected to a first string select line SSL1 in common may correspond to a first row, NAND cell strings NS21, NS22, and NS23 connected to a second string select line SSL2 in common may correspond to a second row, and NAND cell strings NS31, NS32, and NS33 connected to a third string select line SSL3 in common may correspond to a third row.

The string select transistor SST may be connected to a corresponding string select line SSL1, SSL2, or SSL3. The plurality of memory cells MC1 through MC8 may be connected to corresponding word lines WL1 through WL8, respectively. The ground select transistor GST may be connected to a corresponding ground select line GSL1, GSL2, or GSL3, and the string select transistor SST may be connected to a corresponding bit line BL1, BL2, or BL3. The ground select transistor GST may be connected to the common source line CSL.

According to a present exemplary embodiment of the inventive concept, word lines at a same height (e.g., WL1) are commonly connected, the string select lines SSL1 through SSL3 are separated from one another, and the ground select lines GSL1 through GSL3 are also separated from one another. For example, in the case of programming memory cells that are connected to the first word lines WL1 and included in the NAND cell string NS11, NS12, and NS13 corresponding to the first column, the first word lines WL1 and the first select lines SSL1 are selected. However, the inventive concept is not limited thereto. According to another exemplary embodiment, the ground select lines GSL1 through GSL3 are commonly connected.

Figures 5, 6:
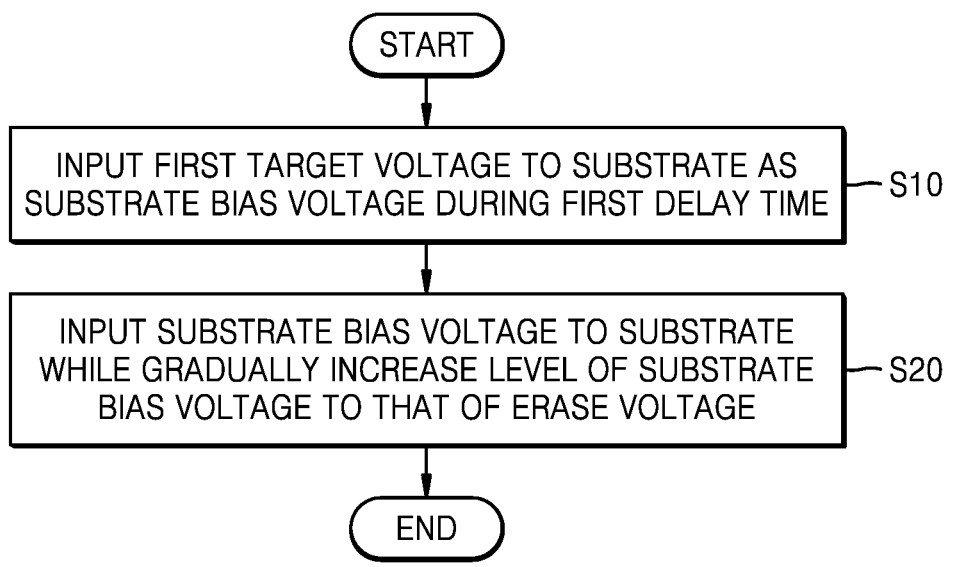
FIG. 5 is a table showing an example embodiment of voltage conditions during an erase operation of the memory device of FIG. 1.
FIG. 6 is a flowchart showing an erase operation of a memory device according to an exemplary embodiment of the inventive concept.

FIG. 5 is a table showing an example embodiment of voltage conditions during an erase operation of the memory device 100 of FIG. 1. For example, an erase operation may be performed by memory blocks. Referring to the memory block BLK1 described above with reference to FIG. 3, an erase operation will be described.

In an exemplary embodiment, in an erase operation, string select lines SSL are floated, and a word line erase voltage Vwe is applied to the word lines WL1 through WL8. In the embodiment, a ground voltage VSS is applied to the ground select lines GSL during the first delay time. In an embodiment, after the first delay time, the ground select lines GSL are floated. In an exemplary embodiment, a first target voltage V_TG1 is applied to the substrate SUB during the first delay time and, after the first delay time, an erase voltage V_ERS is applied to the substrate SUB. Further, the erase voltage V_ERS may continue to be applied to the substrate SUB until the erase operation has completed.

In an embodiment, the substrate SUB and the surface layer S include a silicon material of a same conductivity type. Therefore, the erase voltage V_ERS applied to the substrate SUB after the first delay time is transferred to the surface layer S. In an exemplary embodiment, the erase voltage V_ERS is higher than the word line erase voltage Vwe.

After the first delay time, the ground select lines GSL and the string select lines SSL are floated. Therefore, when the voltage of the surface layer S is changed, the ground select lines GSL and the string select lines SSL may be influenced by coupling (e.g., a capacitive coupling). In other words, when the voltage of the surface layer S rises to the erase voltage V_ERS, the voltages of the ground select lines GSL and the string select lines SSL may also rise. Therefore, the ground select transistors GST and the string select transistors SST may be erase-inhibited.

The word line erase voltage Vwe is applied to the word lines WL1 through WL8. In an exemplary embodiment, the word line erase voltage Vwe is lower than the erase voltage V_ERS. In an embodiment, the word line erase voltage Vwe is the same as the ground voltage VSS. Due to voltage differences between the surface layer S and the word lines WL1 through WL8, Fowler-Nordheim tunneling occurs in the memory cells MC1 through MC8, and thus the memory cells MC1 through MC8 are erased.

FIG. 6 is a flowchart showing an erase operation of a memory device according to an exemplary embodiment of the inventive concept. FIG. 6 shows an erase operation of the memory device 100 of FIG. 1.

Referring to FIG. 6, a first target voltage (e.g., V_TG1 in FIG. 5) is input as the substrate bias voltage V_SUB to a substrate (e.g., the substrate SUB of FIG. 3) during a first delay time (operation S10). For example, operation S10 may be performed by the substrate bias circuit 150 based on an erase enable signal E_EN. For example, the erase enable signal E_EN may indicate that an erase operation is to be performed. According to an exemplary embodiment, the first target voltage (e.g., V_TG1 in FIG. 5) is input to the substrate as step-pulses.

Next, the substrate bias voltage V_SUB is input to the substrate (e.g., the substrate SUB of FIG. 3) while the level of the substrate bias voltage V_SUB is gradually increased to that of the erase voltage (e.g., the V_ERS in FIG. 5) (operation S20). For example, the substrate bias circuit 150 may ramp up the substrate bias voltage V_SUB from the level of the first target voltage (e.g., V_TG1 in FIG. 5) to that of the erase voltage (e.g., V_ERS in FIG. 5) and output the ramped-up substrate bias voltage V_SUB to the substrate (e.g., the substrate SUB in FIG. 3).

According to an exemplary embodiment, in operation S20, the ground select line GSL is floated. For example, the row decoder 130 may float the ground select line GSL while the substrate bias voltage V_SUB is ramped up, based on the control of the control logic circuit 120.

Figure 7:
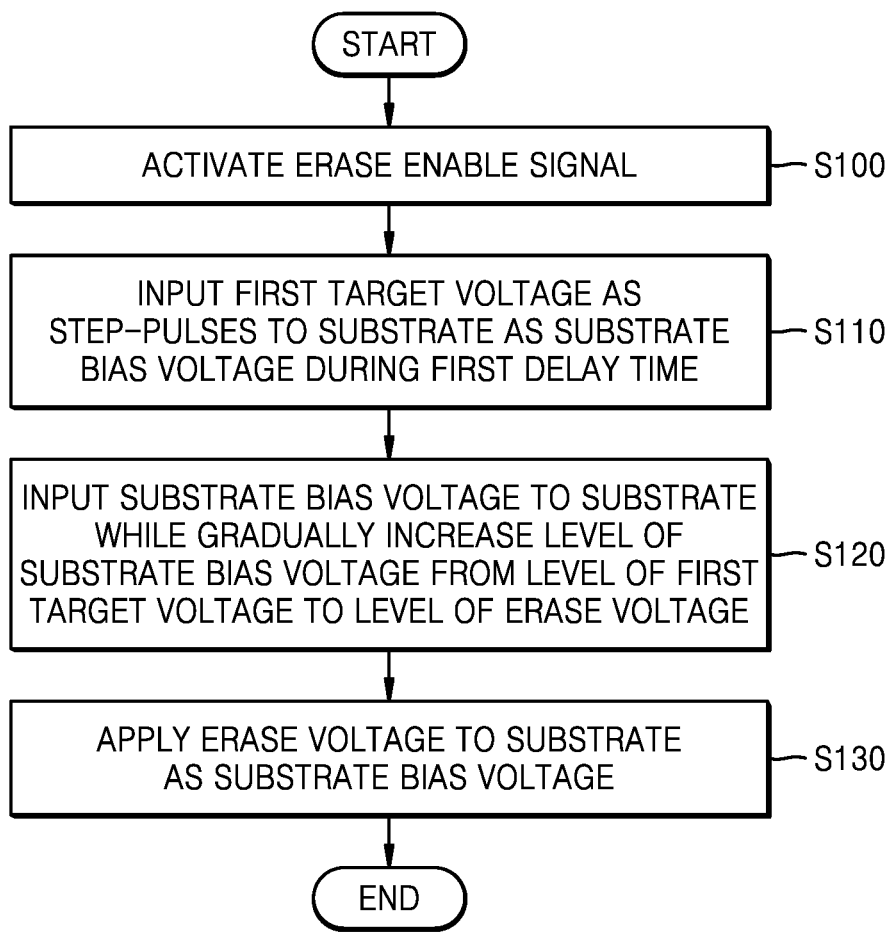
FIG. 7 is a flowchart showing an erase operation of a memory device according to an exemplary embodiment of the inventive concept.

FIG. 7 is a flowchart showing an erase operation of a memory device according to an exemplary embodiment of the inventive concept. FIG. 7 shows an erase operation of the memory device 100 of FIG. 1.

Referring to FIG. 7, an erase enable signal E_EN is activated (operation S100). For example, operation S100 may be performed by the control logic circuit 120 based on a control signal CTRL received from a device outside the memory device 100. In an embodiment, the control logic circuit 120 outputs the erase enable signal initially in a deactivated data, and then sets the ease enable signal to an activated state when it receives a command CMD corresponding to a delete operation.

Next, a first target voltage (e.g., V_TG1 in FIG. 5) as step-pulses is applied to the substrate (e.g., the substrate SUB in FIG. 3) for the first delay time as a substrate bias voltage V_SUB (operation S110). For example, operation S110 may be performed by the substrate bias circuit 150 based on the activated erase enable signal E_EN.

Next, the substrate bias voltage V_SUB is input to the substrate (e.g., the substrate SUB of FIG. 3) while the level of the substrate bias voltage V_SUB is gradually increased to that of the erase voltage (e.g., the V_ERS in FIG. 5) (operation S120). According to an exemplary embodiment, the ground select line GSL is floated in operation S120. Next, an erase voltage (e.g., V_ERS in FIG. 5) is applied to the substrate (e.g., the substrate SUB of FIG. 3) as the substrate bias voltage V_SUB.

Figure 8A:
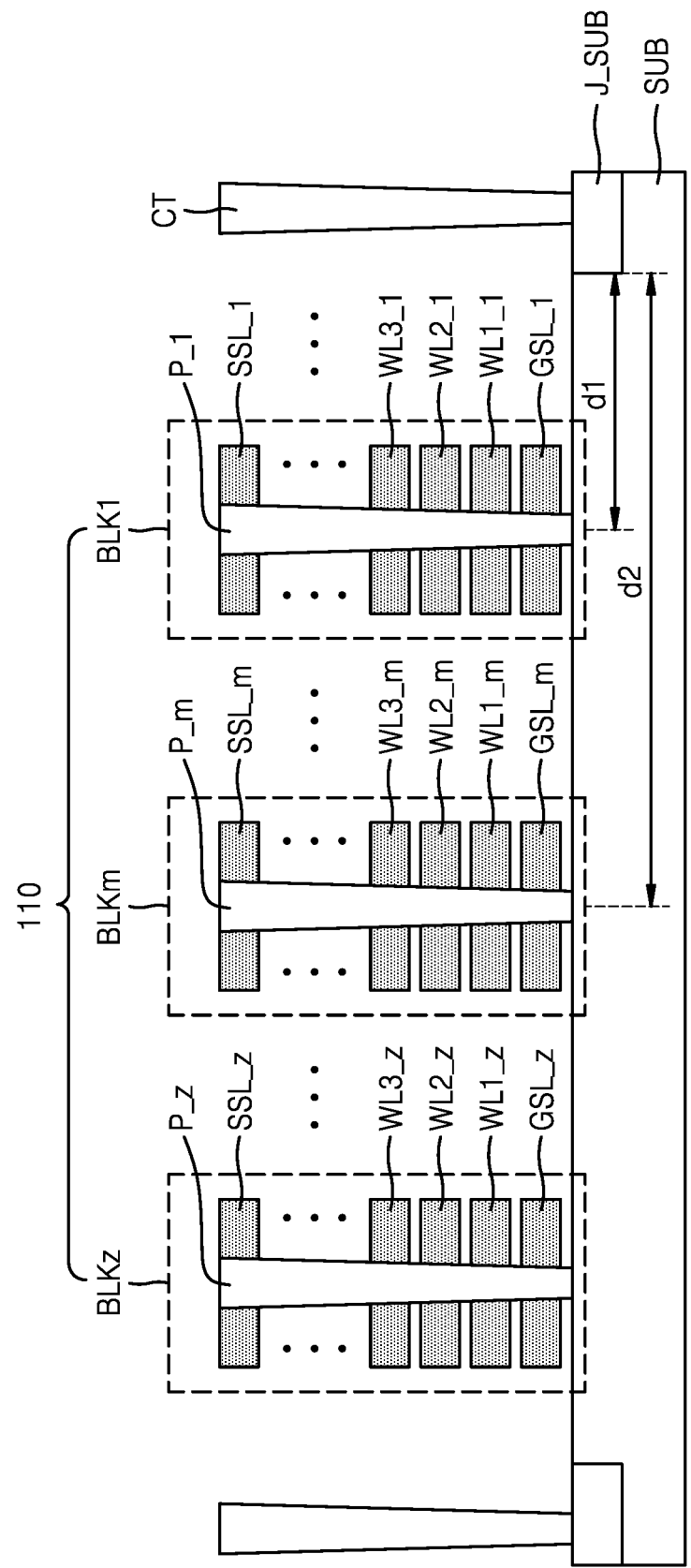
FIGS. 8A through 8C are diagrams for describing a memory device according to an example embodiment and a method of erasing the same.
Figure 8B:
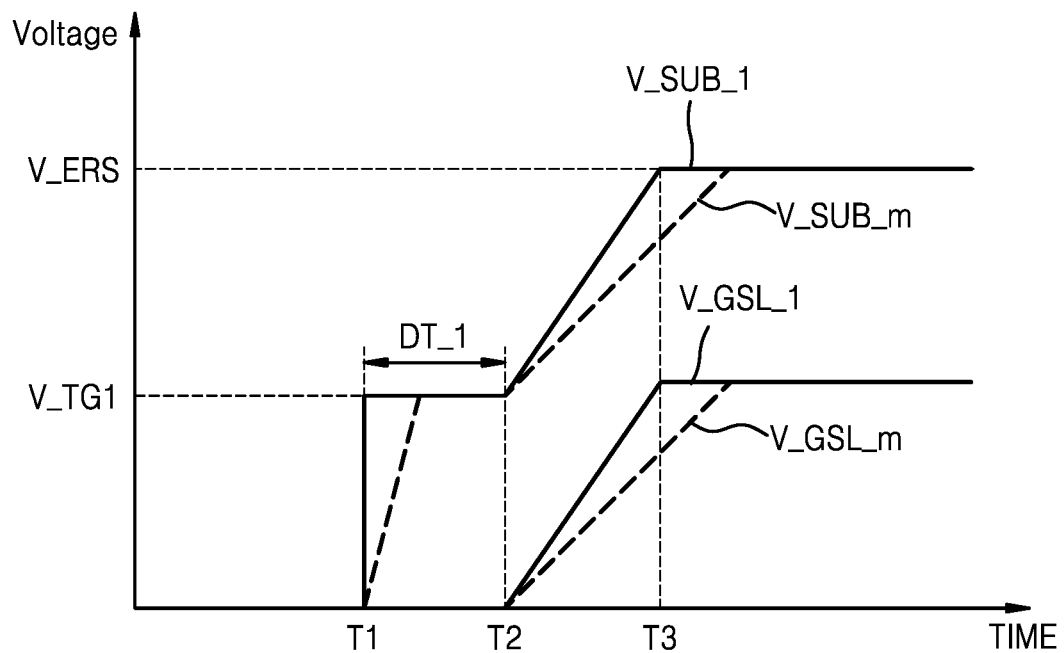
Figure 8C:
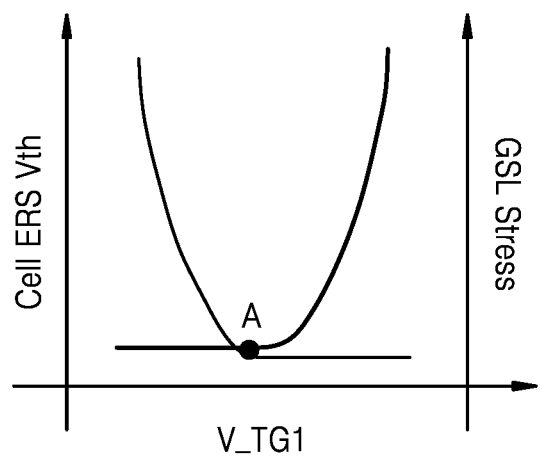

FIGS. 8A through 8C are diagrams for describing a memory device according to an exemplary embodiment and a method of erasing the same. In detail, FIG. 8A briefly shows cross-sectional structures of a memory cell array and a substrate, and FIG. 8B shows a graph showing respective changes of voltages according to time. Furthermore, FIG. 8C shows a graph for describing selection of a first target voltage. For example, FIGS. 8A through 8C may show the memory device 100 of FIG. 1 and an erase operation of the memory device 100.

Referring to FIG. 8A, the memory cell array 110 is disposed on the substrate SUB, and the memory cell array 110 includes the plurality of memory blocks BLK1 through BLKz. Although only the first memory block BLK1, an m-th memory block BLKm, and a z-th memory block BLKz are shown in FIG. 8A, it is merely for convenience of explanation as the inventive concept is not limited thereto. Here, m and z are different natural numbers greater than 1. Furthermore, although FIG. 8A shows that each of the memory blocks BLK1, BLKm, and BLKz includes only one cell string, it is also merely for convenience of explanation as the inventive concept is not limited thereto.

The substrate SUB includes a substrate junction region J_SUB. For example, an upper portion of the substrate SUB may be replaced with the substrate junction region J_SUB. Further, additional substrate junctions may be present at different locations in the substrate SUB. For example, the substrate junction region J_SUB may be doped with an impurity of a conductivity type identical to that of the substrate SUB. In an embodiment, the doping concentration of the substrate junction region J_SUB is higher than the doping concentration of the substrate SUB.

The substrate junction region J_SUB is connected to, for example, one or more contact plugs CT. Although not shown, a contact plug CT may be connected to the substrate bias circuit 150 through a certain wiring. Therefore, the substrate junction region J_SUB may receive the substrate bias voltage V_SUB through the contact plug CT. The contact plug CT may be implemented with a conductive material.

The first memory block BLK1 is located a first distance d1 from the substrate junction region J_SUB. For example, the first memory block BLK1 may be a memory block closest to the substrate junction region J_SUB from among the plurality of memory blocks BLK1 through BLKz. The first memory block BLK1 includes a first pillar P_1, a first ground select line GSL_1, first word lines (e.g., WL1_1, WL2_1, WL3_1), and a first string select line SSL_1.

The m-th memory block BLKm is located a second distance d2 from the substrate junction region J_SUB. The m-th memory block BLKm includes an m-th pillar P_m, an m-th ground select line GSL_m, m-th word lines (e.g., WL1_m, WL2_m, WL3_m), and an m-th string select line SSL_m. In an embodiment, the second distance d2 is greater than the first distance d1. According to an exemplary embodiment, the m-th memory block BLKm is a memory block located at the center from among the memory blocks BLK1 through BLKz. Therefore, when the substrate bias voltage V_SUB is applied to the substrate junction region J_SUB through the contact plug CT, the substrate bias voltage V_SUB reaches a region of the substrate SUB overlapping with the m-th memory block BLKm later than a region of the substrate SUB overlapping with the first memory block BLK1. The z-th memory block BLKz includes a z-th pillar P_z, a z-th ground select line GSL_z, z-th word lines (e.g., WL1_z, WL2_z, WL3_m), and an m-th string select line SSL_m.

Referring to FIG. 8B, for example, the substrate bias circuit 150 outputs the first target voltage V_TG1 as the substrate bias voltage V_SUB to the substrate SUB at a first time point T1. The first time point T1 may be, for example, a time point at which the erase enable signal E_EN output by the control logic circuit 120 is activated.

According to an exemplary embodiment, at the first time point T1, the substrate bias circuit 150 outputs the first target voltage V_TG1 as step-pulses to the substrate SUB. Furthermore, according to an exemplary embodiment, the substrate bias circuit 150 outputs the first target voltage V_TG1 to the substrate SUB during a first delay time DT_1.

According to an exemplary embodiment, the first delay time DT_1 is set based on the second distance d2. For example, when the m-th memory block BLKm is a memory block located at the center from among the plurality of memory blocks BLK1 through BLKz, the rate at which a substrate bias voltage V_SUB_m applied to the region of the substrate SUB overlapping with the m-th memory block BLKm may be slowest. Therefore, the first delay time DT_1 may be sufficiently set for the substrate bias voltage V_SUB_m to reach the first target voltage V_TG1. For example, an RC time constant regarding a path for transferring the substrate bias voltage V_SUB_m may be determined according to the second distance d2, and the first delay time DT_1 may be set based on the RC time constant.

Referring to FIG. 8C, the erase threshold voltage of each memory cell and stress of a ground select line may be changed according to the level of the first target voltage V_TG1. For example, as the level of the first target voltage V_TG1 decreases, the erase threshold voltage of each memory cell is increased and the stress of the ground select line is lowered. Furthermore, as the level of the first target voltage V_TG1 increases, the erase threshold voltage of each memory cell is lowered and the stress of the ground select line is increased. In other words, the erase threshold voltage of each memory cell and the stress of the ground select line according to the level of the first target voltage V_TG1 may have a trade-off relationship.

Therefore, the level of the first target voltage V_TG_1 may be set by taking the erase threshold voltage of each memory cell and the stress of the ground select line into account. For example, the first target voltage V_TG_1 may be set based on a point A where a graph of the erase threshold voltages of each memory cell according to the first target voltage V_TG_1 meets a stress graph of the ground select line.

Referring back to FIGS. 8A and 8B, the substrate bias voltage V_SUB_m of the region of the substrate SUB overlapping with the m-th memory block BLKm may reach the first target voltage V_TG1 later than a substrate bias voltage V_SUB_1 of the region of the substrate SUB overlapping with the first memory block BLK1. However, since the substrate bias circuit 150 outputs the first target voltage V_TG1 to the substrate SUB during an optimized first delay time DT_1, the substrate bias voltage V_SUB_m reaches the first target voltage V_TG1 within the first delay time DT_1, After the first delay time DT_1, at a second time point T2, the substrate bias circuit 150 gradually increases the substrate bias voltage V_SUB_1 from the level of the first target voltage V_TG1 to the level of the erase voltage V_ERS and outputs the substrate bias voltage V_SUB_1 to the substrate SUB. At the second time point T2, for example, the row decoder 130 may float ground select lines GSL_1 through GSL_z based on the control of the control logic circuit 120. Therefore, a voltage V_GSL_1 of the ground select line included in the first memory block BLK1 may be coupled to the substrate bias voltage V_SUB_1, and a voltage V_GSL_m of the ground select line included in the m-th memory block BLKm may be coupled to the substrate bias voltage V_SUB_m. Although it is described that the ground select lines GSL_1 through GSL_z are floated at the second time point T2, that is, after the first delay time DT_1, the inventive concept is not limited thereto as the ground select lines GSL_1 through GSL_z may be floated during the delay time DT_1. For example, time points at which ground select lines GSL_1 through GSL_z start to be floated are not limited to time points after the first delay time DT_1. For example, the ground select lines GSL_1 through GSL_z may start to be floated during the first delay time DT_1 and may also be floated for a certain time period after the first delay time DT_1. Furthermore, according to another exemplary embodiment, at the second time point T2, the substrate bias circuit 150 applies step-pulses, thereby increasing the level of the substrate bias voltage V_SUB_1 from the level of the first target voltage V_TG1 to the level of the erase voltage V_ERS and outputs the substrate bias voltage V_SUB_1 to the substrate SUB.

At a third time point T3, the substrate bias voltage V_SUB_1 output by the substrate bias circuit 150 reaches the erase voltage V_ERS. Subsequently, the substrate bias circuit 150 outputs the erase voltage V_ERS to the substrate SUB as the substrate bias voltage V_SUB_1 until an erase operation has completed.

According to an exemplary embodiment, as the first target voltage V_TG1 is applied to the substrate SUB for the first delay time DT_1 during an erase operation, substrate bias voltages applied to regions of the substrate SUB overlapping with respective memory blocks reach a same level and then are ramped up. For example, in a COP structure, even when the substrate SUB includes poly-silicon doped with a first conductivity type (e.g., p-type), substrate bias voltages applied to regions of the substrate SUB overlapping with different memory blocks (e.g., BLK1 and BLKm) all reach a same level and then are ramped up. Therefore, after the substrate bias voltage V_SUB_m reaches the erase voltage V_ERS, the voltages of the ground select lines included in the respective memory blocks may have levels substantially identical to one another. Therefore, the reliability of the erase operation may be improved. Furthermore, by applying the first target voltage V_TG1 as step-pulses, the speed of the erase operation may be improved.

Figure 9A:
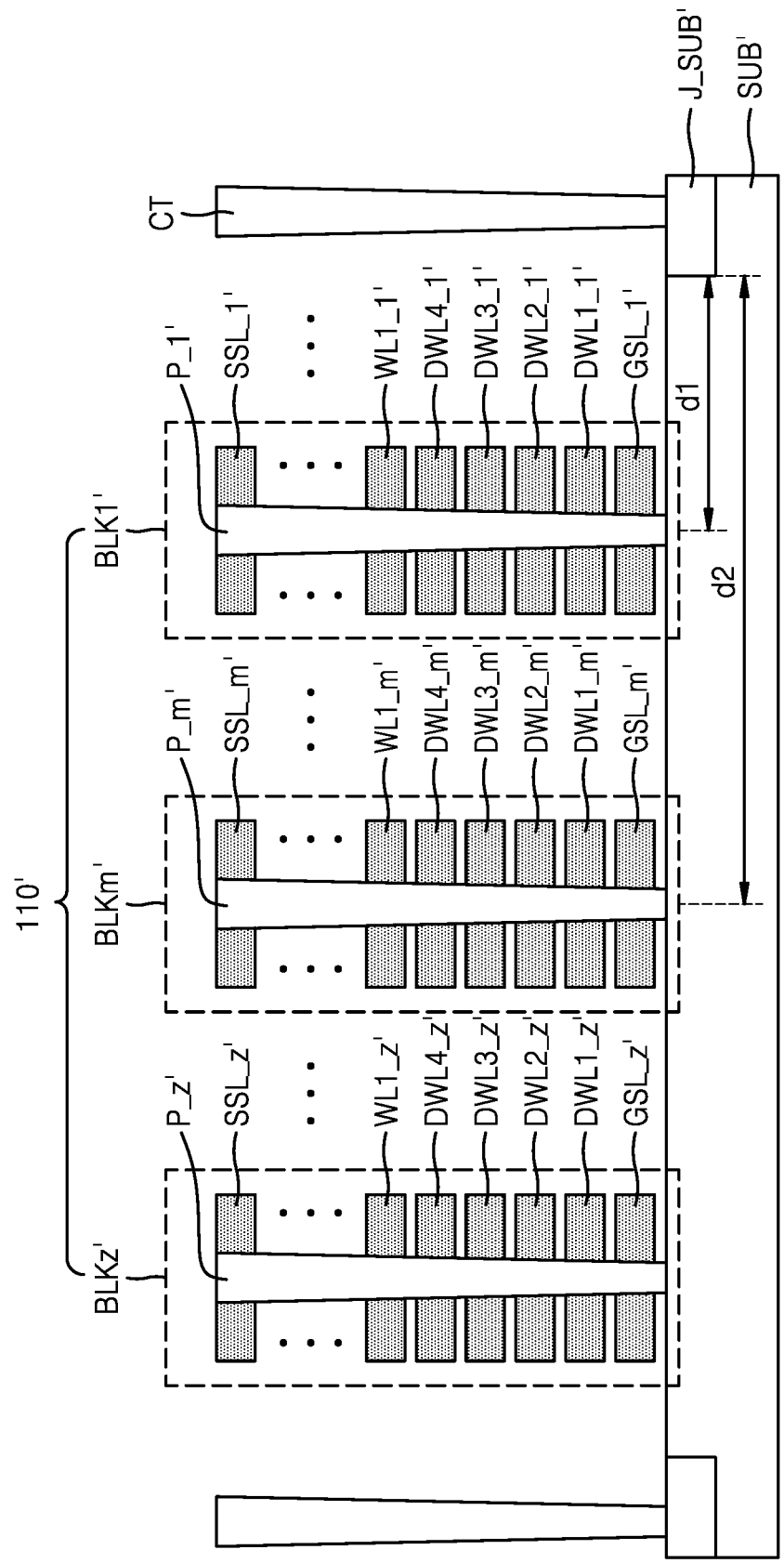
FIGS. 9A and 9B are diagrams for describing a memory device according to an example embodiment and a method of erasing the same.
Figure 9B:
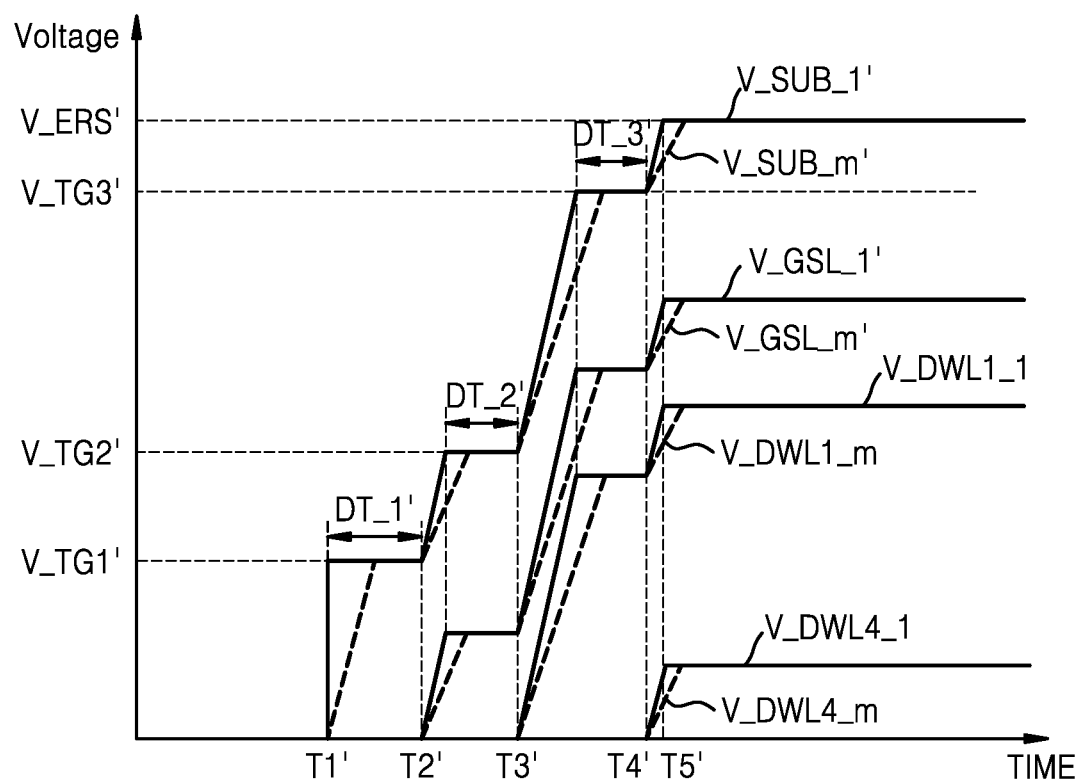

FIGS. 9A and 9B are diagrams for describing a memory device according to an exemplary embodiment and a method of erasing the same. In detail, FIG. 9A briefly shows cross-sectional structures of a memory cell array and a substrate, and FIG. 9B shows a graph showing respective changes of voltages according to time. Descriptions identical to those given above with reference to FIGS. 8A and 8B will be omitted. Furthermore, unless described otherwise, the descriptions given above with reference to FIG. 1 also apply to the description given with reference to FIGS. 9A and 9B.

Referring to FIG. 9A, a memory cell array 110' includes one or more dummy word lines disposed between a word line and a ground select line. For example, a first memory block BLK1' includes first through fourth dummy word lines DWL1_1' through DWL4_1' between a first word line WL1_1' and a first ground select line GSL_1', an m-th memory block BLKm' includes first through fourth dummy word lines DWL1_m' through DWL4_m' between an m-th word line WL1_m' and an m-th ground select line GSL_m', and a z-th memory block BLKz' includes first through fourth dummy word lines DWL1_z' through DWL4_z' between a z-th word line WL1_z' and a z-th ground select line GSL_z'. Although four dummy word lines are illustrated in each memory block in FIG. 9A, the inventive concept is not limited thereto. Memory blocks other than the first memory block BLK1' may also have the same configuration as the first memory block BLK1'. Further, the first memory block BLK1' includes a first pillar P_1', the m-th memory block BLKm' includes a p-th pillar P_m', and the z-th memory block BLKz' includes a z-th pillar P_z'. At least one substrate junction region J_SUB' is disposed in the substrate SUB' of the memory cell array 110'.

Referring to FIG. 9B, for example, the substrate bias circuit 150 outputs a first target voltage V_TG1' to a substrate SUB' as the substrate bias voltage V_SUB at a first time point T1'. For example, the target voltage V_TG1' may be applied to the substrate junction region J_SUB'. According to an exemplary embodiment, the substrate bias circuit 150 outputs the first target voltage V_TG1' to the substrate SUB during the first delay time DT_1'.

After the first delay time DT_1', at a second time point T2', the substrate bias circuit 150 gradually increases the substrate bias voltage V_SUB_1' from the level of the first target voltage V_TG1' to the level of a second target voltage V_TG2' and outputs the substrate bias voltage V_SUB_1' to the substrate SUB. In an embodiment, the level of the second target voltage V_TG2' is lower than the level of an erase voltage V_ERS'. Furthermore, at the second time point T2', for example, the row decoder 130 may float ground select lines GSL_1' and GSL_m' based on the control of the control logic circuit 120.

When the substrate bias voltage V_SUB_1' reaches the second target voltage V_TG2', the substrate bias circuit 150 outputs the second target voltage V_TG2' to the substrate SUB as the substrate bias voltage V_SUB_1' during a second delay time DT_2'. According to an exemplary embodiment, the second delay time DT_2' is set based on a second distance d2'. For example, the second delay time DT_2' may be set sufficiently for a substrate bias voltage V_SUB_m' of a region of the substrate SUB overlapping with an m-th memory block BLKm' to reach the second target voltage V_TG2'.

After the second delay time DT_2', at a third time point T3', the substrate bias circuit 150 gradually increases the substrate bias voltage V_SUB from the level of the second target voltage V_TG2' to the level of a third target voltage V_TG3' and outputs the substrate bias voltage V_SUB_1' to the substrate SUB. In an embodiment, the level of the third target voltage V_TG3' is lower than the level of the erase voltage V_ERS'.

Furthermore, at the third time point T3', for example, the row decoder 130 may float first dummy word lines DWL 1_1' and DWL 1_m' based on the control of the control logic circuit 120. Therefore, a voltage V_DWL1_1 of the first dummy word line DWL1_1' included in the first memory block BLK1' may be coupled to a substrate bias voltage V_SUB_1' and a voltage V_DWL1_m of the first dummy word line DWL1_m' may be coupled to the substrate bias voltage V_SUB_m'.

When the substrate bias voltage V_SUB reaches the third target voltage V_TG3', the substrate bias circuit 150 outputs the third target voltage V_TG3' to the substrate SUB as the substrate bias voltage V_SUB during a third delay time DT_3'. According to an exemplary embodiment, the third delay time DT_3' is set based on the second distance d2'. For example, the third delay time DT_3' may be set sufficiently for a substrate bias voltage V_SUB_m' of a region of the substrate SUB overlapping with an m-th memory block BLKm' to reach the third target voltage V_TG3'.

After the third delay time DT_3', at a fourth time point T4', the substrate bias circuit 150 gradually increases the substrate bias voltage V_SUB from the level of the third target voltage V_TG3' to the erase voltage V_ERS' and outputs the substrate bias voltage V_SUB_1' to the substrate SUB. Furthermore, at the fourth time point T4', for example, the row decoder 130 may float fourth dummy word lines DWL4_1' and DWL4_m' based on the control of the control logic circuit 120. Therefore, a voltage V_DWL4_1 of the fourth dummy word line DWL4_1' included in the first memory block BLK1' may be coupled to the substrate bias voltage V_SUB_1' and a voltage V_DWL4_m of the first dummy word line DWL4_m' may be coupled to the substrate bias voltage V_SUB_m'.

According to an exemplary embodiment, when each of the memory blocks BLK1' through BLKz' includes a plurality of dummy word lines, the row decoder 130 may float a dummy word line closest to a ground select line and a dummy word line closest to a word line from among the plurality of dummy word lines, based on the control of the control logic circuit 120. Furthermore, from among the plurality of dummy word lines, dummy word lines other than the dummy word line closest to the ground select line and the dummy word line closest to the word line may be applied with, for example, a word line erase voltage (Vwe in FIG. 5).

At a fifth time point T5', the substrate bias voltage V_SUB_1' reaches the erase voltage V_ERS'. Subsequently, the substrate bias circuit 150 outputs the erase voltage V_ERS' to the substrate SUB as the substrate bias voltage V_SUB_1' until the erase operation has completed.

Figure 10:
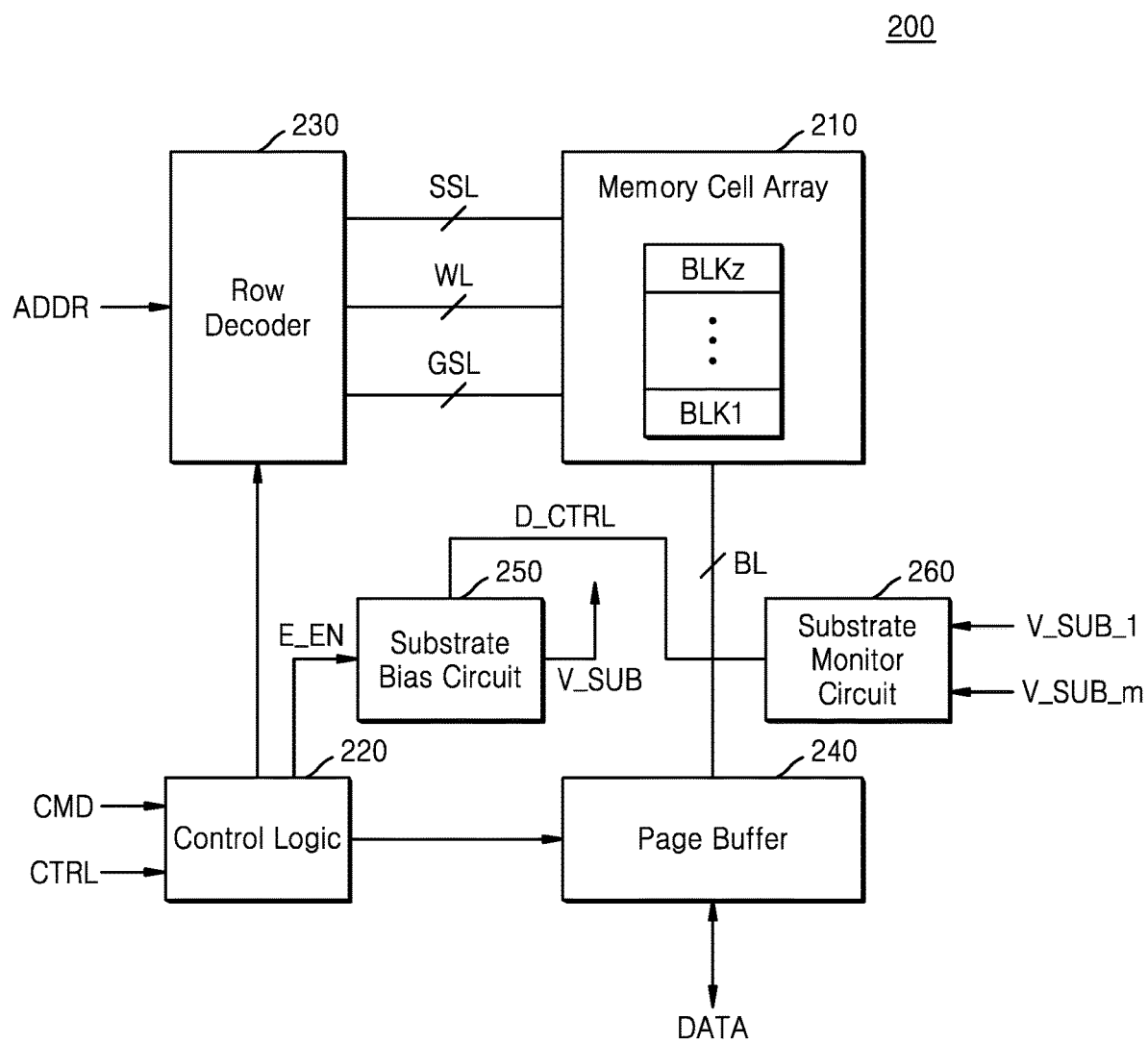
FIG. 10 is a block diagram showing a memory device according to an exemplary embodiment of the inventive concept.

FIG. 10 is a block diagram showing a memory device according to another exemplary embodiment of the inventive concept. Descriptions identical to those given above with reference to FIG. 1 will be omitted.

Referring to FIG. 10, a memory device 200 further includes a substrate monitoring circuit 260. The substrate monitoring circuit 260 monitors voltages applied to a substrate (e.g., the substrate SUB of FIG. 3) and outputs a delay control signal D_CTRL based thereon.

According to an exemplary embodiment, the substrate monitoring circuit 260 monitors a substrate bias voltage V_SUB_1 of a region of the substrate (e.g., the substrate SUB of FIG. 3) overlapping with a first memory block (e.g., BLK1 in FIG. 8A) and a substrate bias voltage V_SUB_m of a region of the substrate (e.g., the substrate SUB of FIG. 3) overlapping with an m-th memory block (e.g., BLKm in FIG. 8A) and outputs the delay control signal D_CTRL based on the substrate bias voltages V_SUB_1 and V_SUB_m.

The substrate bias circuit 250 outputs a substrate bias voltage V_SUB based on the erase enable signal E_EN output from the control logic circuit 220 and the delay control signal D_CTRL output from the circuit monitoring circuit 260. According to an exemplary embodiment, in response to the erase enable signal E_EN, the substrate bias circuit 250 generates a first target voltage during the first delay time as the substrate bias voltage V_SUB regarding the substrate (e.g., the substrate SUB of FIG. 3) supporting the memory cell array 210. In an embodiment, the first delay time is set based on the delay control signal D_CTRL.

Figure 11:
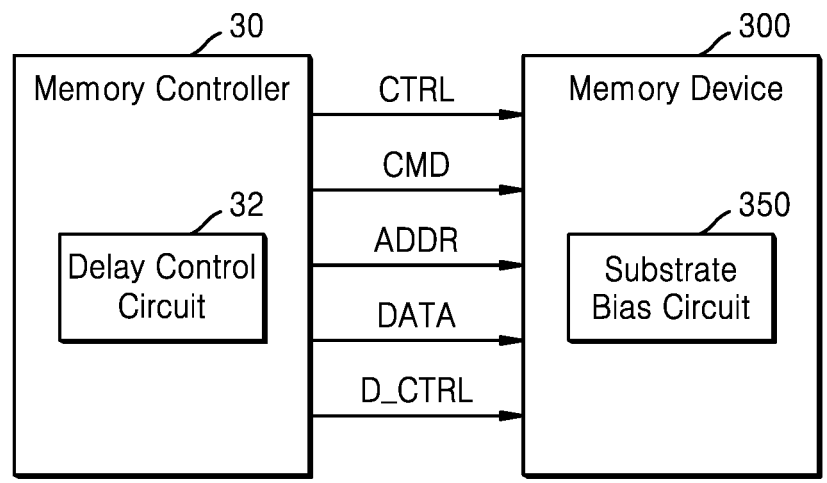
FIG. 11 is a block diagram showing a memory system according to an exemplary embodiment of the inventive concept.

FIG. 11 is a block diagram showing a memory system according to an exemplary embodiment of the inventive concept.

Referring to FIG. 11, a memory system 3 includes a memory controller 30 and a memory device 300. The memory controller 30 includes a delay control circuit 32, and the memory device 300 includes a substrate bias circuit 350. The memory device 300 may be implemented, for example, in a form substantially similar to that of the memory device 100 shown in FIG. 1.

The memory controller 30 may be connected to a host HOST and the memory device 300. In response to a request from the host HOST, the memory controller 30 may be configured to access the memory device 300. For example, the memory controller 30 may be configured to control program, read, erase, and background operations regarding the memory device 300. In an embodiment, the memory controller 30 provides an address ADDR, a command CMD, and a control signal CTRL to the memory device 300, thereby controlling program, read, and erase operations regarding the memory device 300. Furthermore, data DATA for a program operation and read-out data DATA may be transmitted and received between the memory controller 30 and the memory device 300.

Although not shown, the memory controller 30 may include a RAM, a processing unit, a host interface, and a memory interface. The RAM may be used as an operation memory of the processing unit, and the processing unit may control operations of the memory controller 30. The host interface may include a protocol for performing data exchange between the host HOST and the memory controller 30. For example, the memory controller 30 may be configured to communicate with the host (HOST) via at least one of various interface protocols such as USB, MMC, PCI-E, advanced technology attachment (ATA), serial-ATA, parallel-ATA, SCSI, ESDI, and integrated drive electronics.

According to an exemplary embodiment, the delay control circuit 32 outputs a delay control signal D_CTRL to control a delay time regarding the substrate bias voltage V_SUB during an erase operation of the memory device 300. In an exemplary embodiment, the substrate bias circuit 350 included in the memory device 300 outputs a first target voltage as the substrate bias voltage V_SUB during a first delay time based on the delay control signal D_CTRL and, after the first delay time, gradually increases the level of the substrate bias voltage V_SUB to that of an erase voltage and outputs the substrate bias voltage V_SUB to the substrate. Although it is described that the delay control signal D_CTRL is separate from the control signal CTRL, the delay control signal D_CTRL may also be included in the control signal CTRL and provided to the memory device 300.

Figure 12:
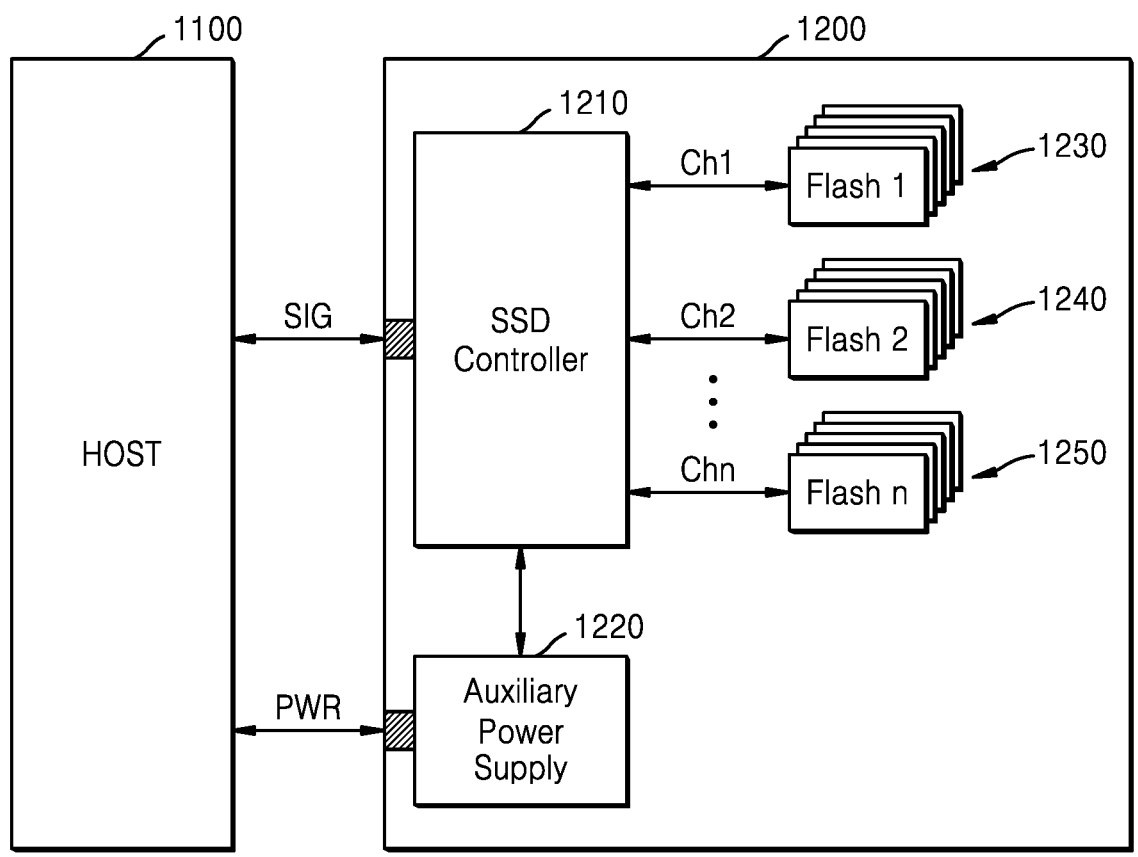
FIG. 12 is a block diagram showing a solid state drive (SSD) system including a memory device according to an exemplary embodiment of the inventive concept.

FIG. 12 is a block diagram showing a solid state drive (SSD) system including a memory device according to an exemplary embodiment of the inventive concept.

Referring to FIG. 12, an SSD system 1000 includes a host 1100 (e.g., a host device) and an SSD 1200. The SSD 1200 may transmit/receive signals SIG to/from the host 1100 through a signal connector and may receive power PWR through a power connector.

The SSD 1200 includes an SSD controller 1210 (e.g., a control circuit), an auxiliary power supply 1220, and a plurality of memory devices 1230, 1240, and 1250. Each of the plurality of memory devices 1230, 1240, and 1250 may be a vertically-stacked NAND flash memory device and may be implemented according to the embodiments described above with reference to FIGS. 1 through 11. Therefore, each of the memory devices 1230, 1240, and 1250 may perform an erase operation with improved reliability and speed.

While the inventive concept has been particularly shown and described with reference to embodiments thereof, it will be understood that various changes in form and details may be made therein without departing from the spirit and scope of the inventive concept.

What is claimed is:

1. A non-volatile memory device comprising:
   a substrate;
   a memory cell array comprising a plurality of gate conductive layers stacked on the substrate and a plurality of pillars penetrating through the plurality of gate conductive layers and extending in a direction perpendicular to a top surface of the substrate, wherein at least one of the plurality of gate conductive layers is a ground select line;
   a control logic circuit configured to output an erase enable signal for controlling an erase operation with respect to the memory cell array;
   a substrate bias circuit configured to, in response to the erase enable signal, output a substrate bias voltage at a first target level to the substrate from a first time to a second time after the first time during a first delay period and, after the first delay period, gradually increase a level of the substrate bias voltage to an erase voltage having a higher level than the first target level; and
   a row decoder configured to apply a ground voltage to the ground select line based on control of the control logic circuit during the first delay period.

2. The nonvolatile memory device of claim 1, wherein the substrate further comprises a substrate junction region connected to one or more contact plugs and receiving the substrate bias voltage via the one or more contact plugs, the memory cell array comprises a first memory block located a first distance from the substrate junction region and a second memory block located a second distance from the substrate junction region, the second distance is greater than the first distance, from among the plurality of memory blocks, and the first delay period is based on the first distance and the second distance.

3. The non-volatile memory device of claim 2, wherein the second memory block is a memory block located at the center from among the plurality of memory blocks.

4. The non-volatile memory device of claim 2, wherein, in at least a portion of the first delay period, a level of the substrate bias voltage applied to a region of the substrate overlapping with the second memory block is substantially identical to the first target level.

5. The non-volatile memory device of claim 1, wherein the substrate bias circuit outputs the first target voltage as step-pulses during at least a portion of the first delay period.

6. The non-volatile memory device of claim 1, wherein the row decoder floats the ground select line after the first delay period.

7. The non-volatile memory device of claim 1, wherein at least one of the control logic circuit and the substrate bias circuit is arranged to overlap with the memory cell array in the vertical direction.

8. The non-volatile memory device of claim 1, further comprising a monitoring circuit configured to monitor voltages applied to the substrate and output a delay control signal to the substrate bias circuit for controlling the first delay period, wherein the delay control signal is based on a result of the monitoring.

9. A method of erasing a non-volatile memory device comprising a substrate and a plurality of memory blocks including a plurality of cell strings disposed on the substrate and a plurality of cell transistors stacked in a direction perpendicular to the substrate, each cell including one or more ground select transistors, the method comprising:

applying, by a control circuit of the non-volatile memory, a ground voltage to a ground select line connected to the ground select transistor and a substrate bias voltage at a first target level to the substrate from a first time to a second time after the first time, during a first delay period; and gradually increasing, by the control circuit, a level of the substrate bias voltage to an erase voltage having a higher level than the first target, after the first delay period.

10. The method of claim 9, wherein, in the applying of the substrate bias voltage at the first target level to the substrate, a voltage at the first target level is input to the substrate as step-pulses.

11. The method of claim 9, wherein the gradually increasing of the level of the substrate bias voltage further comprises floating the ground select line.

12. The method of claim 9, wherein each of the plurality of cell transistors further comprises one or more dummy transistors arranged between the plurality of cell transistors and the ground select transistor, and the gradually increasing of the level of the substrate bias voltage to the erase voltage further comprises:

gradually increasing the level of the substrate bias voltage to a second target level having a higher level than the first target level and a lower level than the erase voltage, during a second time period; and floating dummy word lines connected to the one or more dummy transistors.

13. The method of claim 12, wherein each of the plurality of cell strings comprises a plurality of dummy transistors, and, in the floating of the dummy word lines, dummy word lines connected to, from among the plurality of dummy transistors, at least one of a dummy transistor adjacent to the ground select transistor and a dummy transistor adjacent to the plurality of cell transistors are floated.

14. The method of claim 13, wherein the floating of the dummy word lines further comprises applying a word line erase voltage to dummy word lines connected to dummy transistors other than the dummy transistor adjacent to the ground select transistor and the dummy transistor adjacent to the plurality of cell transistors.

15. The method of claim 9, wherein the substrate further comprises a substrate junction region, which is connected to one or more contact plugs and receives the erase voltage via the one or more contact plugs, further comprising setting the first delay period based on a distance between the substrate junction region and a memory block disposed at a center of the plurality of memory blocks.

16. The method of claim 9, further comprising:

monitoring voltages applied to respective regions of the substrate overlapping with at least two memory blocks from among the plurality of memory blocks; and setting the first delay period based on a result of the monitoring.

17. A method of erasing a non-volatile memory device comprising a substrate and a plurality of memory blocks including a plurality of gate conductive layers stacked on the substrate and a plurality of pillars penetrating through the plurality of gate conductive layers and extending in a direction perpendicular to a top surface of the substrate, the method comprising:

applying, by a control circuit of the non-volatile memory device, step-pulses to the substrate during a first delay period until a substrate bias voltage of the substrate reaches a first target level, in response to an erase enable signal; and gradually increasing, by the control circuit, a level of the substrate bias voltage from the first target level to an erase voltage having a higher level than the first target level.

18. The method of claim 17, wherein at least one of the plurality of gate conductive layers is a ground select line, and further comprises floating the ground select line.

19. The method of claim 17, wherein the substrate further comprises a substrate junction region connected to one or more contact plugs and receiving the substrate bias voltage via the one or more contact plugs, further comprising setting the first delay period based on a distance between the substrate junction region and a memory block disposed at a center of the plurality of memory blocks.

20. The method of claim 17, wherein at least one of the plurality of gate conductive layers is a dummy word line, and the gradually increasing of the level of the substrate bias voltage further comprises:

gradually increasing the level of the substrate bias voltage to a second target level higher than the first target level and lower than the erase voltage, during a second delay period; and floating dummy word lines connected to one or more dummy transistors.

* * * * *